United States Patent [19]
Hall

[11] Patent Number: 5,164,812
[45] Date of Patent: Nov. 17, 1992

[54] CONDUCTANCE MODULATED INTEGRATED TRANSISTOR STRUCTURE WITH LOW DRAIN CAPACITANCE

[76] Inventor: John H. Hall, 3169 Payne Ave., Apt. #50, San Jose, Calif. 95117

[21] Appl. No.: 694,435

[22] Filed: May 1, 1991

[51] Int. Cl.[5] ............................................. H01L 27/02
[52] U.S. Cl. ................................... 257/369; 257/378; 257/474
[58] Field of Search .................... 357/15, 43, 23.7, 49, 357/42, 34, 46

[56] References Cited

U.S. PATENT DOCUMENTS

| | | | |
|---|---|---|---|
| 4,339,767 | 7/1982 | Horng et al. | 357/49 |
| 4,487,639 | 12/1984 | Lam et al. | 357/49 |
| 4,566,914 | 1/1986 | Hall | 357/42 |
| 4,862,232 | 8/1989 | Lee | 357/49 |
| 4,879,255 | 11/1989 | Deguchi et al. | 357/43 |
| 4,920,399 | 4/1990 | Hall | 357/15 |
| 5,021,858 | 6/1991 | Hall | 357/41 |
| 5,061,981 | 10/1991 | Hall | 357/15 |

Primary Examiner—Andrew J. James
Assistant Examiner—Sara W. Crane
Attorney, Agent, or Firm—Townsend and Townsend

[57] ABSTRACT

Disclosed is an integrated transistor structure having increased conductance and operating speed including a complementary insulated gate field-effect transistor pair, each transistor including a source region and a drain region with a gate contact positioned over a channel region therebetween, an ohmic contact to the source regions, and a Schottky contact or PN rectifying junction to each of the drain regions. The dopant concentration of the drain regions is sufficiently low to prevent the Schottky contacts from forming ohmic contacts with the drain regions. The gates of the two transistors are interconnected and function as the input terminal, and the two Schottky contacts are interconnected as the output of the device. The operation of the device is such that the lightly doped drain regions act as bases of bipolar transistors, with the emitters formed by the Schottky and PN diodes. Majority carriers injected by the Schottky diodes modulate the channel regions, thereby lowering their resistivity and increasing the transconductance of the device without increasing the physical size or the capacitance of the device and thereby improving the speed of the device. Speed of operation in enhanced by providing dielectric material between the drain regions and the substrate.

5 Claims, 1 Drawing Sheet

CONDUCTANCE MODULATED INTEGRATED TRANSISTOR STRUCTURE WITH LOW DRAIN CAPACITANCE

This invention is related to my co-pending applications Ser. No. 07/500,227 filed Mar. 27, 1990 as a continuation of application Ser. No. 07/053,303 filed May 22, 1987 entitled "Double Diffused CMOS with Schottky to Drain Contacts" and Ser. No. 07/528,950 filed May 25, 1990 for "Compound Modulated Integrated Structure," and to my U.S. Pat. No. 4,566,914 for "Method of Forming Localized Epitaxy and Devices Formed Therein."

BACKGROUND OF THE INVENTION

This invention relates generally to semiconductor devices and more particularly the invention relates to an integrated transistor logic device utilizing conductance modulation to increase transconductance and switching speed.

The conductance modulated transistor pair is described in my U.S. Pat. No. 4,920,399 and copending U.S. patent application Ser. No. 07/528,950, supra. These devices have increased conductance and operating speed by merging complementary bipolar transistors in complementary MOS transistors (CBiCMOS).

The use of Schottky injection of majority and minority carriers to increase the transconductance of an MOS transistor is discussed by Hall in U.S. Pat. No. 4,920,399 and minority carrier injection into an MOS transistor invention is described in U.S. patent application Ser. No. 07/528,950. These described inventions increase the circuit speed by increasing the transconductance of the MOS transistor while reducing the capacitance reflected to the drain/base node from the output load capacitance. This technique continues to increase the circuit speed until the FT (Unity gain operating frequency) of the bipolar transistor becomes a limiting term or the load capacitance becomes large and limiting in the case of the CBiCMOS structure. A speed of operation limitation of such devices is due to the large capacitance existing between the drain/base node of the transistors and ground. In the case of the Schottky structure the capacitance between the drain and ground is the speed limiting term under low capacitance load conditions.

The present invention is directed to modifying the CBiCMOS and the conductance modulated transistor structure to include a layer of dielectric isolation which surrounds a portion of the drain/base structure to reduce its capacitance and increase operating speed while reducing operating power. By using a layer of silicon oxide ($SiO_2$) or silicon nitride ($Si_3N_4$) dielectric beneath the inactive drain-emitter area a further increase in speed can be achieved over that of the previous inventions as a result of the reduced capacitance of the critical node. This structure is achieved by first forming a dielectric layer on the surface of the single crystal substrate, which is localized to the area underneath the drain contact. This step is done prior to the growth of the epitaxial layer in which the transistors are formed. The injecting edge of the emitter is formed in the single crystal portion of the epitaxial film just adjacent the polycrystalline silicon formed directly above the dielectric pad area.

SUMMARY OF THE INVENTION

Accordingly, an object of the invention is an integrated transistor structure having improved operating speed.

Another object of the invention is an insulated gate compound transistor structure using modulated conduction, vertical bipolar transistor action, and reduced parasitic capacitance to increase operating speed.

A feature of the invention is the use of an insulating layer beneath a portion of the drain and emitter area in a complementary pair inverter.

Briefly, a CMOS transistor pair is fabricated in the surface of a lightly-doped (on the order of $10^{12}$ atoms per cubic centimeter) semiconductor body such as an epitaxial layer formed on a supporting substrate. The drain region of each transistor is lightly doped (on the order of $10^{16}$ atoms per cubic centimeter) and a Schottky contact or P/N rectifying junction is made thereto as a drain contact. The resistivity of the drain region is sufficiently high to prevent formation of an ohmic contact to the drain region by the Schottky metal. The common gate terminals function as the device input, and the common Schottky contacts or P/N rectifying junctions function as the device output.

Prior to the formation of the epitaxial layer, a thin insulating layer is formed on the single crystal supporting substrate and then photoresist masked and etched so that it forms an insulating pad on the substrate only in the areas where the MOS transistor drain contacts will eventually be formed. When the epitaxial layer is deposited over the surface of the substrate to a thickness of 1 to 10 microns the portion of the silicon directly above the dielectric pads is partially polycrystalline and capacitively isolated from the substrate. The surface of the epitaxy is then polished flat. When the CMOS transistors are formed in the epitaxial layer the majority of the drain area and the Schottky contact or P/N junction will reside in the capacitively isolated area. The lateral edge of the rectifying contact will inject majority and minority carriers into the MOS channel regions increasing the MOS transistor conductance and inject minority carriers into the buried layer causing bipolar transistor action.

In operation, the drains of the transistors are floating and form the bases of bipolar transistors with Schottky diodes functioning as the emitters. The Schottky diodes inject majority carriers when the MOS gates are turned on and cause a significant reduction in the on resistance of the channel regions thereby increasing its current handling capacity, without increasing the gate-to-drain capacitance, and thereby increasing the inverter switching speed. Thus, the majority carriers injected by the Schottky diodes modulate the channel regions, thereby lowering their resistivity at the same time as the minority carriers are collected by the source and buried layer. The net result of the structure is to increase the transconductance without increasing the physical size or the capacitance for the device, thereby improving the speed of the devise as the Schottky structure allows for a very rapid recovery from the conduction mode. Due to the reduce emitter-base capacitance of the bipolar transistor, the transistor will have a higher Ft (Unity gain frequency) allowing it to operate effectively to higher frequencies. The drain/base area will now have a substantially reduced capacitance allowing this node to be driven at a much higher speed by the MOS transistor. In addition to these enhancements, the power usually dissipated due to the operating voltage swing across the drain to substrate capacitance will be reduced in proportion to the square of the capacitance reduction in the drain area.

The invention and objects and features thereof will be more readily apparent from the following detailed description and appended claims when taken with the drawings.

DETAILED DESCRIPTION OF ILLUSTRATIVE EMBODIMENTS

Figure 1:
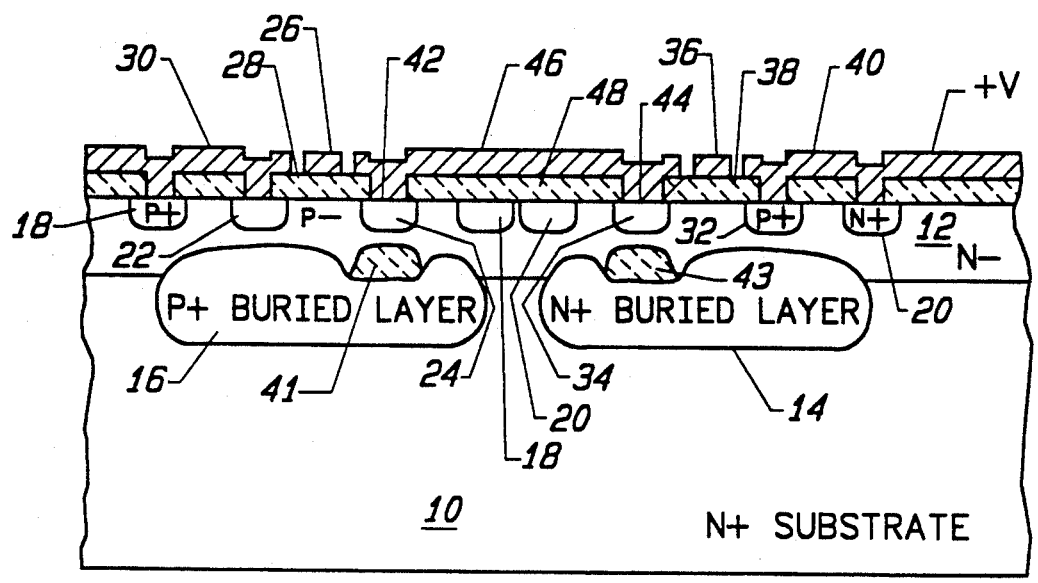
FIG. 1 is a section view of a complementary MOS transistor pair fabricated in accordance with the present invention.

Referring now to the drawing, FIG. 1 is a section view illustrating an integrated transistor structure in accordance with one embodiment of the invention. In this embodiment, an n+ monocrystalline silicon substrate 10 has an n− epitaxial silicon layer 12 formed thereon. The dopant concentration of the epitaxial layer is very light, on the order of $10^{12}$ atoms per cubic centimeter. Areas 41 and 43 are areas of silicon oxide (SiO2) and/or silicon nitride (Si3N4) 4000 angstroms to 10,000 angstroms thick and formed by deposition after the buried layer implants are formed in the area directly under where the drain areas will eventually be located after the deposition of the epitaxial layer. The silicon above these pads is primarily polycrystalline. An n+ buried layer 12 and a p+ buried layer 16 are provided at the interface of the epitaxial layer 12 and substrate 10. Conventionally, the buried layer is formed by highly doped surface regions of the substrate 10 prior to the epitaxial growth of layer 12. The portion of the n− epitaxial layer is 12 above the p+ buried layer 16 is converted to p− conductivity by ion implantation. P+ buried regions 18 are formed at the surface of epitaxial layer 12 and define a device region above the p+ buried layer 16, and n+ regions 20 are formed in the surface of the epitaxial layer 12 of the n+ buried layer region 14 and define a second device region.

An n-channel insulated-gate transistor is formed in the first device region with n+ source region 22 formed in the surface and a lighter-doped n− region 24 spaced from the n+ region 22 and defining the drain region. A gate contact 26 is formed over an insulated layer 28 between the source 22 and drain 24. A first metallization 30 interconnects the source 22 to a −v contact. Similarly, a p-channel insulated-gate transistor is fabricated in the second device region above the n+ buried layer 14 with a p+ region 32 forming the source and a lighter-doped p− region 34 forming the drain. A gate contact 36 is formed over an insulating layer 38 between the source 32 and drain 34. Metallization 40 connects the source 32 with a +V contact. This structure is similar to the structures disclosed in my U.S. Pat. No. 4,920,399 and my pending application Ser. No. 07/528,950, supra.

In accordance with the invention, Schottky or PN rectifying junctions 42 and 44 are respectively made to the n− drain 24 and to the p− drain 34 of the two transistors. In the embodiment of FIG. 1, a Schottky contact 42 is fabricated using platinum silicide or molybdenum in contact with the lightly-doped drain region 24. A Schottky contact 44 is fabricated using titanium or titanium molybdenum formed over an insulated layer 48 such as silicon oxide on the surface of the epitaxial layer 12.

Figure 2:
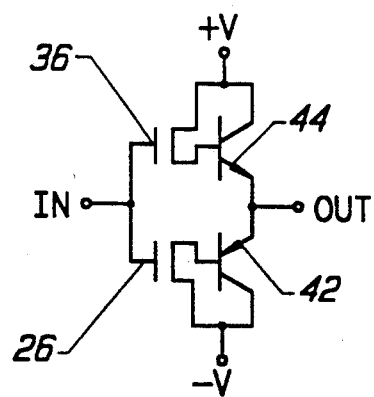
FIG. 2 is a schematic diagram of the integrated transistor of FIG. 1.

As described above, the drains of each transistor are lightly doped, on the order of $10^{16}$ atoms/cc, whereby the Schottky metal does not form an ohmic contact to the drain regions. FIG. 2 is an electrical schematic of the structure in which the input is applied to the common terminal of the gates 26 and 36 of the two field-effect transistors, and the output is taken at the common connection of the Schottky contacts 42, 44 of the two transistors. As described above, in operation of the device the lightly-doped drain regions function as bases of bipolar transistors with the emitters formed by the Schottky diodes. The majority carriers injected by the Schottky diodes modulate the channel region thereby lowering its resistivity at the same time the minority carriers are collected by the source and the buried layer diffused into the substrate under the epitaxial region of the two transistors structures. The net result of this structure is to increase the transconductance by a factor of 5 without increasing the physical size or capacitance of the device, thereby improving the speed of the device. The Schottky contacts allow for a very rapid recovery from the conduction mode.

There has been described an integrated transistor logic device in which Schottky contacts to the drain regions of complementary transistors provide conductance modulation, thereby increasing the transconductance and operating speed of the device. In addition the capacitance of the drain has been reduced through the use of a silicon oxide or silicon nitride pad beneath the epitaxial layer in the drain region.

While the invention has been described with reference to a specific embodiment, the description is illustrative of the invention and is not to be construed as limiting the invention. For example, the Schottky contacts can be replaced by doped regions forming rectifying (P/N) junctions with the drain regions. Various modifications and applications may occur to those skilled in the art without departing from the true spirit and scope of the invention as defined by the appended claims.

I claim:

1. An integrated transistor structure comprising
    a semiconductor body having a first device region of a first conductivity type and a second device region of a second conductivity type therein,
    a first device formed in said first device region and including a source region and a drain region of second conductivity type, said source and drain regions being spaced apart by a channel region, a gate contact between said source and drain regions and insulatively spaced from said device region, an ohmic contact to said source region, and a first means forming a rectifying junction with said drain region,
    a second device formed in said second device region and including a source region and a drain region of first conductivity type, said source and drain regions being spaced apart by a channel region, a gate contact between said source and drain regions and insulatively spaced from said second device region, and ohmic contact to said source region and second means forming a rectifying junction with said drain region,
    input connector means interconnecting said gates of said first and second devices, and output connector means interconnecting said first means of said first device and said second means of said second device of said first and second devices, said semiconductor body comprising a substrate of said first conductivity type, and having a major surface, an epitaxial layer on said substrate and of said first conductivity type, a first buried layer in said major surface of first conductivity type under said first device region, a layer of dielectric material on said major surface under said drain region of said first device, a second buried layer in said major surface of second conductivity type under said second device region, and a layer of dielectric material on said major surface under said drain region of said second device, whereby the drain-substrate capacitance is reduced.

2. The integrated transistor structure as defined by claim 1 wherein said first means and said second means are Schottky diodes.

3. The integrated transistor structure as defined by claim 1 wherein said first means and said second means are doped regions in said drain regions.

4. The integrated transistor structure as defined by claim 1 wherein said layers of dielectric material comprise silicon oxide.

5. The integrated transistor structure as defined by claim 1 wherein said layers of dielectric material comprise silicon nitride.

* * * * *